(12) United States Patent
Inoue et al.

(10) Patent No.: US 9,767,966 B2
(45) Date of Patent: Sep. 19, 2017

(54) ELECTRIC EQUIPMENT HAVING MOVABLE PORTION, AND ITS MANUFACTURE

(71) Applicant: FUJITSU LIMITED, Kawasaki-shi, Kanagawa (JP)

(72) Inventors: Hiroaki Inoue, Atsugi (JP); Xiaoyu Mi, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 163 days.

(21) Appl. No.: 14/202,437

(22) Filed: Mar. 10, 2014

(65) Prior Publication Data
US 2014/0183014 A1 Jul. 3, 2014

Related U.S. Application Data

(63) Continuation of application No. PCT/JP2011/005550, filed on Sep. 30, 2011.

(51) Int. Cl.
*H01H 1/00* (2006.01)
*H01G 5/16* (2006.01)
(Continued)

(52) U.S. Cl.
CPC ......... *H01H 1/0036* (2013.01); *B81B 3/0072* (2013.01); *B81B 3/0097* (2013.01);
(Continued)

(58) Field of Classification Search
CPC . B81B 2201/018; B81B 3/0097; B81B 3/072; B81B 2203/0118; B81C 1/0015;
(Continued)

(56) References Cited

U.S. PATENT DOCUMENTS 6,770,569 B2  8/2004  Foerstner et al.
2005/0067292 A1*  3/2005  Thompson .......... B81C 1/00373
                                                            205/118
(Continued)

FOREIGN PATENT DOCUMENTS

CN   101009173 A   8/2007
JP   2005-142982   6/2005
(Continued)

OTHER PUBLICATIONS

International Search Report, mailed in connection with PCT/JP2011/005550 and mailed Nov. 1, 2011, with partial English translation.
(Continued)

*Primary Examiner* — Louis Rufo
(74) *Attorney, Agent, or Firm* — Fujitsu Patent Center

(57) ABSTRACT

On seed metal layer of first metal, pedestal and counter electrode are formed of second metal by plating, adjacent to free space region. The free space region is filled with first sacrificial layer. By using resist pattern, second sacrificial metal layer is formed, extending from the first sacrificial layer to a portion of the pedestal, and lower structure of third metal is formed on the second sacrificial layer, by contiguous plating, exposing a portion of the pedestal not formed with the second sacrificial layer, the third metal having composition and thermal expansion coefficient equivalent to the second metal. Upper structure of fourth metal having composition and thermal expansion coefficient equivalent to the second and third metals is formed on the pedestal and the lower structure by plating. The first and second sacrificial layers are removed, leaving an electric equipment with a movable portion.

12 Claims, 8 Drawing Sheets

(51) Int. Cl.
*B81B 3/00* (2006.01)
*H01H 59/00* (2006.01)

(52) U.S. Cl.
CPC .......... *H01G 5/16* (2013.01); *H01H 59/0009* (2013.01); *B81B 2201/018* (2013.01); *B81B 2203/0118* (2013.01)

(58) Field of Classification Search
CPC .......... C25D 5/02; C25D 5/022; H01H 1/036; H01G 5/16
See application file for complete search history.

(56) References Cited

U.S. PATENT DOCUMENTS

| | | | | |
|---|---|---|---|---|
| 2005/0099252 | A1* | 5/2005 | Isobe | H01P 1/127 335/78 |
| 2006/0208823 | A1* | 9/2006 | Hunt | H01G 7/06 333/24 C |
| 2007/0158200 | A1* | 7/2007 | Cohen | B81C 99/0095 205/80 |
| 2007/0172988 | A1 | 7/2007 | Nakatani et al. | |

FOREIGN PATENT DOCUMENTS

| | | |
|---|---|---|
| JP | 2005-534510 | 11/2005 |
| JP | 2006-062016 | 3/2006 |
| JP | 2007-196303 | 8/2007 |
| JP | 2009-252672 | 10/2009 |
| JP | 2011-173185 | 9/2011 |

OTHER PUBLICATIONS

[CNOA] The First Office Action dated Jul. 1, 2015, issued for Chinese Patent Application No. 201180073766.7, with English translation.

CNOA—Third Office Action for the Chinese Application No. 201180073766.7, mailed on Aug. 24, 2016, with English translation.

* cited by examiner

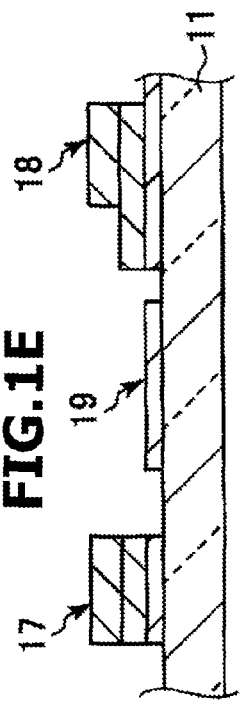
FIG.1E
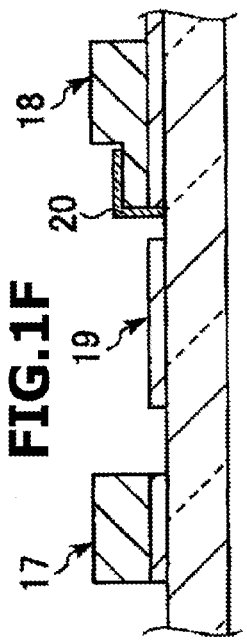
FIG.1F
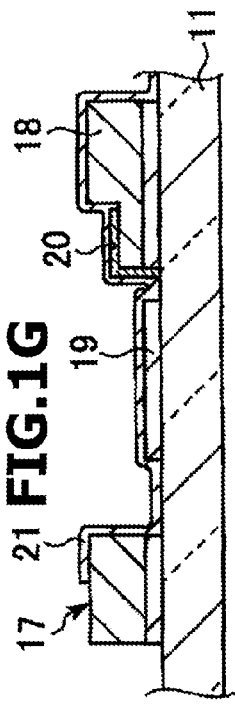
FIG.1G
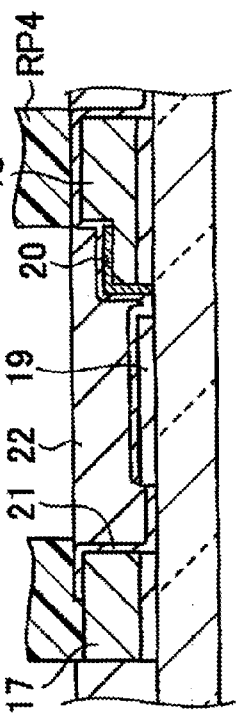
FIG.1H
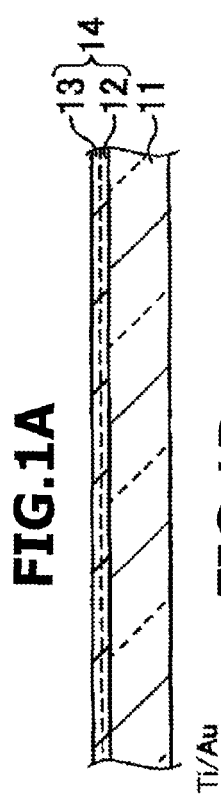
FIG.1A
FIG.1B
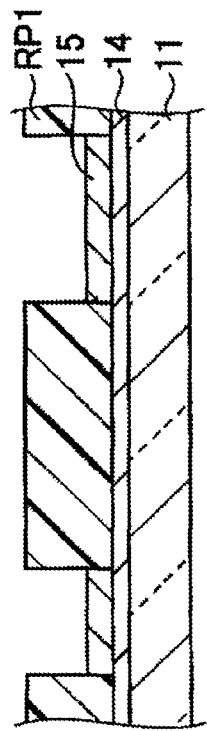
FIG.1C
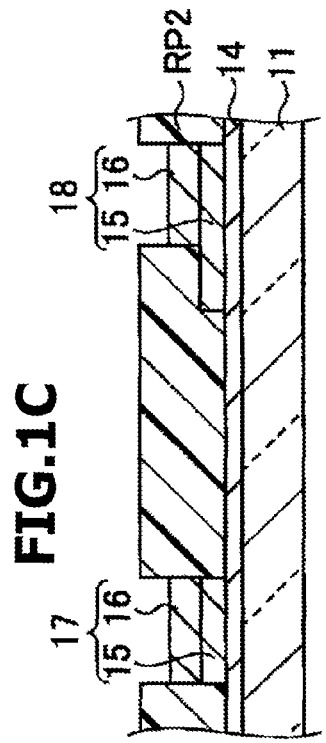
FIG.1D
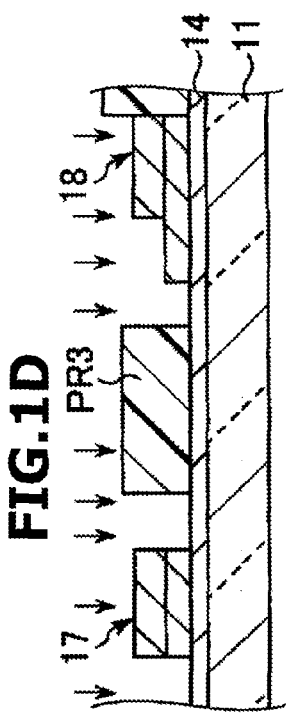

ELECTRIC EQUIPMENT HAVING MOVABLE PORTION, AND ITS MANUFACTURE

CROSS REFERENCE TO RELATED APPLICATIONS

This application is a continuation application of, and claims the benefit of priority of, the prior International Patent Application PCT/JP2011/005550, filed on Sep. 30, 2011, the entire contents of which are incorporated herein by reference.

FIELD

Embodiments of the invention relate to an electric equipment having a movable portion of an MEMS (micro electromechanical system) structure and to a method for manufacturing the electric equipment. An electromechanical member having a constituent portion of a size shorter than the order of millimeters may be called MEMS.

BACKGROUND

To meet demands for smaller size and higher performance regarding high-frequency or radiofrequency (RF) component parts of cellular phones and the like, researches and developments of electric equipment using MEMS technologies are being vigorously carried out. In MEMS devices intended for radiofrequency uses, an RF switch, a variable capacitance or the like employs a movable portion that has a cantilever structure or a both-ends-supported beam (bridge shape) structure that is formed from a metal material structure of low resistance. The movable portion is displaced by piezoelectric drive, electrostatic drive, etc. For performing a desired function, the position of the movable portion should be stably controlled.

An MEMS switch is a mechanical switch that has a static or stationary electrode and a movable electrode facing each other and that performs on-off actions by driving or actuating the movable electrode to contact to or separate from the static electrode. The mechanical switch allows reduction in parasitic capacitance, and is low in loss, high in insulation and less in distortion in signal waveform, in comparison with switches that use semiconductor elements.

In a radiofrequency (RF) circuit, an MEMS capacitance is connected in series to or loaded on a RF line so as to define the frequency characteristic or adjust the distributed constant of the RF line. By using a variable capacitance, it is possible to change the resonance frequency or change the distributed constant. Generally, a variable-capacitance element has such a structure that a fixed electrode and a movable electrode face each other and the capacitance between the electrodes is changed by displacing the movable electrode.

Such a movable electrode is formed of a flexible metal structure that is formed by, for example, plating. Electrolytic plating requires an electricity feeding layer. For example, a stack of an adherence layer that provides adherence with a base and a seed layer made of the same material as a plate layer is formed by sputtering or the like. The adherence layer is formed of, for example, a metal layer of Ti, Cr, Mo, etc. The plate layer is formed, for example, of a highly electroconductive metal such as copper (Cu), gold (Au), etc.

In order to provide for a free space below the flexible metal structure, a method including forming a sacrificial film in a free space, forming a metal structure on top of the sacrificial film, and then removing the sacrificial film is employed. The sacrificial film that is used in this method may be, for example, a metal film of copper, aluminum, etc., an inorganic dielectric film of silicon oxide, silicon nitride, aluminum oxide, etc., or an organic dielectric film of a photosensitive resin, etc.

For example, in order to form a cantilever type movable electrode on a ceramics substrate, a pedestal portion is first formed by processes of forming an adherence layer/seed layer by sputtering or the like, forming a structure that defines a plating region by using a resist pattern or the like, forming a pedestal metal layer by electrolytic plating process, removal of a structure such as the resist pattern or the like, removal of the adherence layer/seed layer that is unnecessary, etc., and a sacrificial film that fills a free space is formed through formation of an adherence layer/seed layer by sputtering or the like, formation of a structure that defines a plating region through the use of a resist pattern or the like, formation of a sacrificial metal layer by an electrolytic plating process, removal of the structure of the resist pattern or the like, etc., and a cantilever structure is formed through formation of an adherence layer/seed layer by sputtering or the like, formation of a structure that defines a plating region through the use of a resist pattern or the like, formation of a movable beam portion metal layer by an electrolytic plating process, removal of the structure of the resist pattern or the like, etc. Thereafter, the sacrificial film and the unnecessary adherence layer/seed layer are removed, so that the cantilever type movable electrode is formed.

The cantilever structure, which is mainly formed from a good conductor such as gold or the like, includes an adherence layer and a seed layer as a base. A metal layer formed by sputtering and a metal layer formed by plating are different from each other in purity and the like and exhibit different physical properties even if the two layers are of the same metal. A stack of metal layers having different physical properties is a stack of metal layers whose thermal expansivities are different.

An electric equipment is subjected to a reflow step at about 260° C. or a temperature impact test at −20° C. to +80° C. Due to the different thermal expansivities, stress occurs between the stacked metal layers, and warpage or strain occurs. For example, a distal end of the cantilever structure warps and becomes displaced upward. In some cases, the distal end of the cantilever structure is displaced upward by 10 μm or more. As a result, the electric equipment fails to operate at a predetermined operating voltage. A cause of such warpage is considered to be that the structure is constructed of a stacked layer structure of layers of different metal materials. For example, the adherence layer and the plated layer are formed of different metal layers.

For example, the adherence layer may have a higher resistivity than the plated layer. If a contact surface of a switch is covered with an adherence layer, high resistance results. In order to reduce such resistance, it has been proposed to remove the adherence layer from the contact surface of a switch (e.g., Japanese Patent Application Publication No. 2007-196303 (JP 2007-196303 A) and Japanese Patent Application Publication No. 2009-252672 (JP 2009-252672 A)).

SUMMARY

According to one aspect, an electric equipment has: a substrate; a seed layer of a first metal material formed above the substrate; a support formed on the seed layer and including at least one pedestal portion of a second metal material; a movable structure that is formed from a metal material having a composition and a thermal expansion coefficient equivalent to the composition and the thermal expansion coefficient of the second metal material, and that is supported on an upper surface of the pedestal portion.

According to another aspect, a method for manufacturing an electric equipment includes: forming a first seed layer of a first metal material above a substrate; forming a support that includes at least one pedestal portion of a second metal material by plating, at a location above the first seed layer and adjacent to a first space region; forming in the first space region a first sacrificial layer different in etching characteristic from the second metal material; forming a second sacrificial layer of a metal material that extends from the first sacrificial layer to a portion of a surface of the pedestal portion; forming, above the second sacrificial layer, a lower structure of a third metal material that has a composition and a thermal expansion coefficient equivalent to the composition and the thermal expansion coefficient of the second metal material, by plating; exposing a surface of the pedestal portion which is not provided with the second sacrificial layer, and forming, on the pedestal portion and the lower structure, an upper structure of a fourth metal material that has a composition and a thermal expansion coefficient equivalent to the composition and the thermal expansion coefficient of each of the second metal material and the third metal material, by plating; and removing the first sacrificial layer and the second sacrificial layer.

The object and advantages of the invention will be realized and attained by means of the elements and combinations particularly pointed out in the claims. It is to be understood that both the foregoing general description and the following detailed description are exemplary and are not restrictive of the invention, as claimed.

BRIEF DESCRIPTION OF DRAWINGS

FIGS. 1A to 1M are sectional views of a substrate schematically illustrating production steps of an electric equipment that has a variable capacitance according to a first embodiment of the invention;

DESCRIPTION OF EMBODIMENTS

Figure 1I:
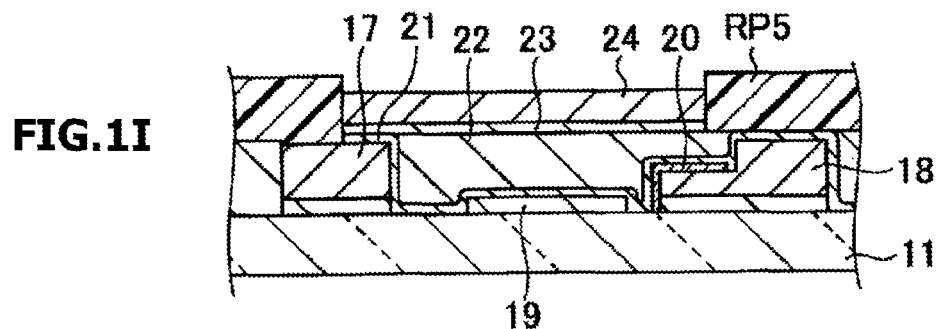

With reference to FIGS. 1A to 1M, a production process for an electric equipment that has a variable capacitance of a cantilever structure according to a first embodiment of the invention will be described.

As illustrated in FIG. 1A, an adherence layer 12 made up of, for example, a Ti film of 50 nm in thickness, and a seed layer 13 made up of, for example, an Au layer of 500 nm in thickness, are deposited on an LTCC (low-temperature co-fired ceramics) substrate 11 by sputtering As the adherence layer, it is permissible to use not only a Ti film but also a Cr film or a Mo film. Hereinafter, for the sake of simplification, the adherence layer 12 and the seed layer 13 will sometimes be collectively termed the base layer or seed layer 14.

As illustrated in FIG. 1B, a resist pattern RP1 having an opening that defines a plating region is formed on the base layer 14, and a first plated layer 15 of Au is formed on the base layer 14 by electrolytic plating. Thereafter, the resist pattern RP1 is removed.

As illustrated in FIG. 1C, a resist pattern RP2 that has an opening that defines an upper structure is newly formed, and the second plated layer 16 of Au is formed by electrolytic plating. The stacking of the first plated layer 15 and the second plated layer 16 forms a three-dimensional structure that has a stepped portion. The second plated layer 16 formed on the first plated layer 15 with a smaller area than the first plated layer 15, produces extending portion that extends farther from the upper plated layer. A pedestal portion 17 having a rectangular sectional shape is formed at a left side in FIG. 1C, and a counter electrode 18 having a lower portion extending farther than the upper portion is formed at a right side in FIG. 1C. Each of the pedestal portion 17 and the counter electrode 18 has a height of about 1 μm to 5 μm. In the counter electrode 18, a thin portion constitutes an electrode and a thick portion constitutes a radiofrequency line. The first plated layer 15 and the second plated layer 16 are formed by using the same plating liquid, and are formed of metal layers that have equivalent compositions and equivalent thermal expansion coefficients. Thereafter, the resist pattern RP2 is removed.

The first plated layer and the second plated layer are formed, for example, of Au alloy that contains 1 wt % to 2 wt % of Ag, Au alloy that contains 0.1 wt % to 25 wt % of Cu, or Au alloy that contains 0.1 wt % to 25 wt % of at least one species selected from the group consisting of Co, Ni and In. The first plated layer and the second plated layer having equivalent compositions means that the first and second layers have the same composition or effectively the same composition. For example, 5 wt % or less of the composition of the first plated layer may be different from the composition of the second plated layer. The difference of the first plated layer in composition from the second plated layer is preferably 2 wt % or less. The first plated layer and the second plated layer having equivalent thermal expansion coefficients means that the first and second plated layers have the same thermal expansion coefficient or effectively the same thermal expansion coefficient. For example, the difference between the thermal expansion coefficient of the first plated layer and the thermal expansion coefficient of the second plated layer may be 1% or less. The difference in thermal expansion coefficient between the first and second plated layers is preferably 0.1% or less.

As illustrated in FIG. 1D, a resist pattern RP3 in the shape of a control electrode is formed between the pedestal portion 17 and the counter electrode 18, and the patterning of the base layer 14 is performed by ion milling using Ar gas. A control electrode is left under the resist pattern RP3.

As illustrated in FIG. 1E, when the resist pattern RP3 is removed, the pedestal portion 17, a control electrode 19 and the counter electrode 18 are left side by side on the LTCC substrate 11.

As illustrated in FIG. 1F, a dielectric film 20 of silicon oxide, silicon nitride, aluminum oxide, tantalum oxide or the like is formed to cover a facing surface of the counter electrode 18. The patterning of the dielectric film 20 may be done by lift-off, etching, etc.

As illustrated in FIG. 1G, a seed layer 21 is formed on the substrate 11 to cover the counter electrode 18 and the control electrode 19 and to partially cover the surface of the pedestal portion 17 and to partially expose the surface thereof. The seed layer 21 is provided so that a Cu layer will be plated on the seed layer 21, and is made of a stack of any one of the combinations of Ti/Cu, Cr/Cu and Mo/Cu (lower adherence layer/upper seed layer).

Figure 2A:
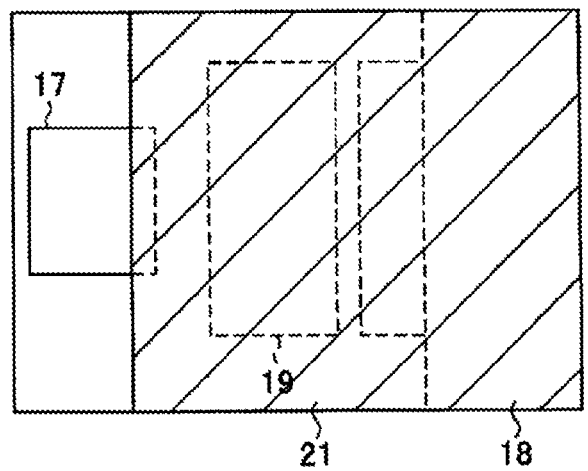
FIGS. 2A, 2B and 2C are plan views illustrating a structure in a plan view in main process steps in the first embodiment.

FIG. 2A is a plan view of the state illustrated in FIG. 1G. The seed layer 21 indicated by hatching covers the counter electrode 18 and the control electrode 19, and also covers a right-side portion of the pedestal portion 17 and exposes the rest of the surface of the pedestal portion 17.

As illustrated in FIG. 1H, a resist pattern RP4 that has an opening for defining the plating region and that covers the pedestal portion 17 and the thick portion of the counter electrode 18 is formed, and electrolytic plating of Cu is performed. Recess portions are filled again by a first sacrificial layer 22 of Cu. Thereafter, the resist pattern RP 4 is removed. The counter electrode 18, the first sacrificial layer 22 and the pedestal portion 17 form a flattened surface.

As illustrated in FIG. 1I, a new resist pattern RP5 for defining a movable electrode is formed. Regarding the counter electrode 18, the resist pattern RP5 is formed from the thick portion to part of the thin portion. Regarding the pedestal portion 17, the resist pattern RP5 covers the portion where the seed layer 21 is not formed. In an opening of the resist pattern RP5, the first sacrificial layer 22 of Cu or the seed layer 21 for Cu plating is exposed. In an opening of the resist pattern RP5, a second sacrificial layer 23 of Cu is formed to a thickness of, for example, 0.5 μm to 1 μm, by electrolytic plating, and then a movable electrode 24 of Au is formed to a thickness of, for example, 2 μm to 5 μm, on the second sacrificial layer 23 by contiguous plating. The second sacrificial layer 23 of Cu functions as a seed layer for the growth of the Au plated layer 24. When the second sacrificial layer of Cu is removed, only the Au plated layer remains. Thereafter, the resist pattern RP5 is removed.

Figure 2B:
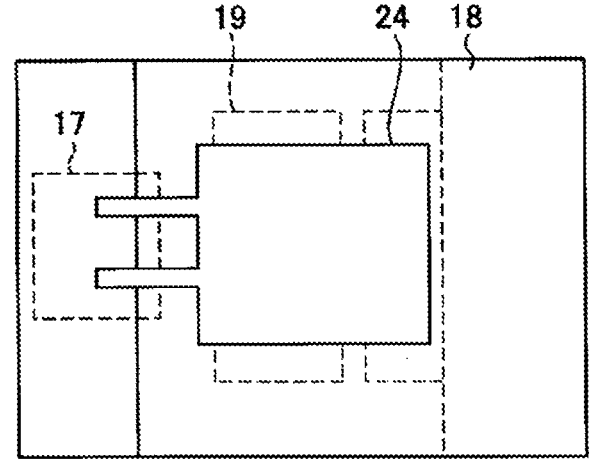

FIG. 2B is a plan view of the state illustrated in FIG. 1I. The movable electrode 24 includes a rectangular main portion and two beams that extend leftward from a left side of the rectangular main portion. In order to facilitate the displacement of the movable electrode 24, the movable electrode 24 has flexible beams at its proximal portion. The length of movable portions of the movable electrode is, for example, 200 μm or longer. The two beams each have an overlap length of, for example, 10 μm or longer, with the pedestal portion 17. The pedestal portion has, for example, a rectangular shape whose side is one hundred and several tens of micrometers long. In the case of a cantilever structure, it is preferable that a proximal portion has an overlap length of about 10 μm to 100 μm that overlaps the upper surface of the pedestal portion 17.

Figure 1J:
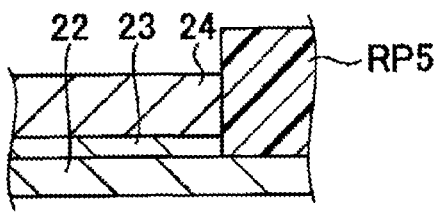

As illustrated in FIG. 1J, end of the interface between the movable electrode 24 of Au and the second sacrificial layer 23 of Cu is defined by the resist pattern RP5, so that a desired shape can be obtained. Trial is also made on plating the movable electrode 24 of Au directly on the opening of the resist pattern RP5 without plating the second sacrificial layer 23. It was found that in this case burr of the Au plated layer was formed on outside of the intended shape. Surface of a copper layer is easily oxidized. Therefore, prior to the copper plating, removal of an oxide film is done. It is considered that a copper oxide film exists on a surface of the first sacrificial layer 22. When the Cu oxide film is removed at the interface between the resist pattern RP5 and the first sacrificial film 22 of Cu, it is considered that gaps will be formed to allow entry of an Au plating liquid. Considering that this causes burr, the Au plating surface is raised by Cu plating to above the interface between the resist pattern and the first sacrificial layer 22 of Cu before the plating of Au is performed.

Due to the contiguous plating of Cu and Au, the entry of the Cu plating liquid into the interface between the resist pattern RP5 and the first sacrificial layer 22 of Cu merely adds a thin Cu plated layer to the surface of the first sacrificial layer 22 of Cu, and the thin Cu plated layer is removed simultaneously with removal of the first sacrificial layer 22, as illustrated in, for example, FIG. 1J. Thus, this contiguous plating has solved the problem of burr.

Figure 1K:
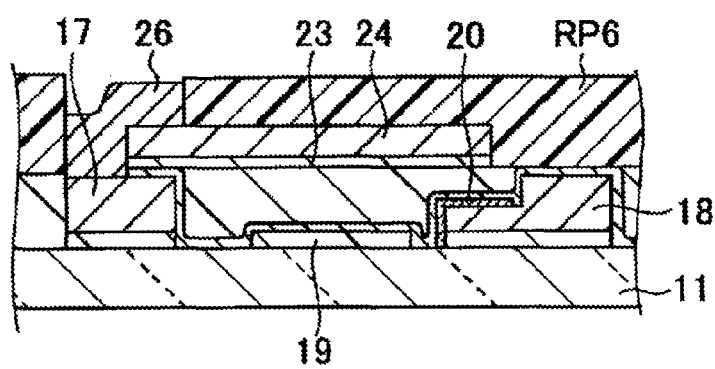

As illustrated in FIG. 1K, a resist pattern RP6 that has an opening above the pedestal portion 17 is formed. The Au surface of the pedestal portion 17 and the Au surface of the movable electrode 24 are exposed in the opening of the resist pattern RP6. By performing electrolytic plating of Au in this state, a fixing layer 26 of Au having a thickness greater than or equal to the thickness of the movable electrode 24 is formed.

Figure 1L:
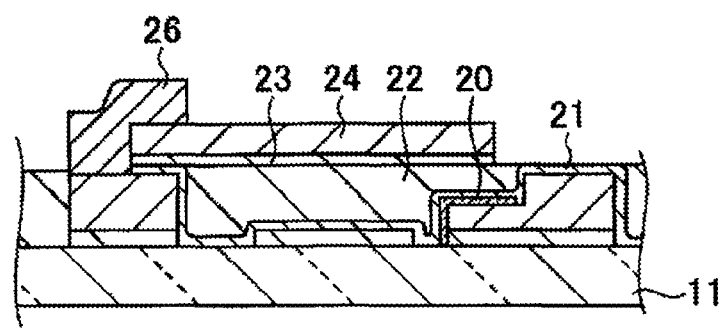
Figure 2C:
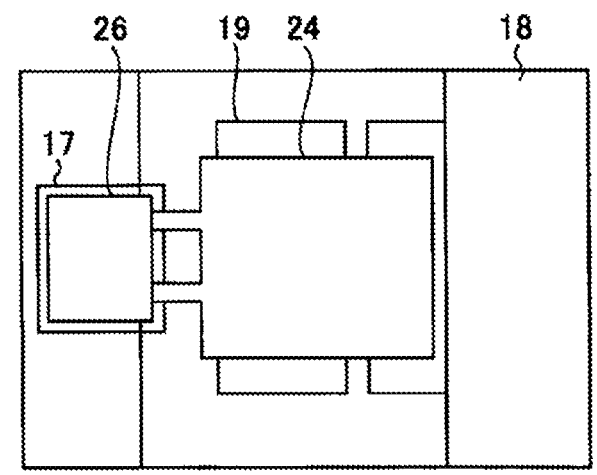

FIG. 1L illustrates a state in which the resist pattern RP6 has been removed. FIG. 2C illustrates a plan view of the state illustrated in FIG. 1L. The fixing layer 26 certainly secures the beams at the proximal beams of the movable electrode 24. Below the movable electrode 24 there exist the first sacrificial layer 22 of Cu and the second sacrificial layer 23 of Cu and also the seed layer 21 for Cu plating. These layers are removed, for example, by wet etching. For the Cu etching, use of an etchant liquid that contains copper ammoniate complex salt is preferable because a fast etching rate of 1 μm/min or greater is obtained and, furthermore, this etching liquid, due to its low viscosity, allows etching even in a small gap of several hundred nanometers, and causes less corrosion of other materials. The Cu layer and the adherence layer both formed by sputtering can also be simultaneously removed all together with the plated Cu layer.

Figure 1M:
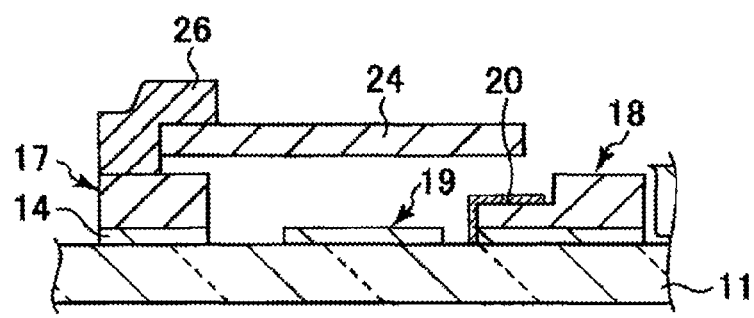

FIG. 1M illustrates a state in which the first sacrificial layer 22, the second sacrificial layer 23 and the seed layer 21 have been removed. The pedestal portion 17 is fixed to the substrate 11 via the seed layer 14. On the seed layer 14, all of the pedestal portion 17, the movable electrode 24 and the fixing layer 26 are formed of Au plated layers, and have equivalent compositions and equivalent thermal expansion coefficients. Therefore, even under changes in temperature, the stress due to differences in thermal expansion coefficient is suppressed, and warp is suppressed.

A slit having a constant height exists between a lower surface of the movable electrode 24 and an upper surface of the pedestal portion 17. This is considered to be a characteristic structure resulting from the previous existence of the seed layer 21 and the second sacrificial layer 23.

Figure 3A:
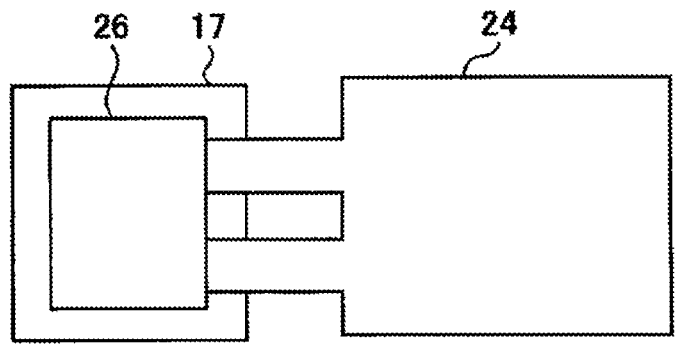
FIGS. 3A to 3D are plan views schematically illustrating a supporting method for a cantilever structure.

The configuration of the movable electrode 24 can be modified in various manners. FIG. 3A illustrates a configuration of the foregoing first embodiment. The movable electrode 24 includes a plurality of beams at a proximal ends of the rectangular main portion. These beams are fixed on the pedestal portion 17 by a fixing layer 26.

Figure 3B:
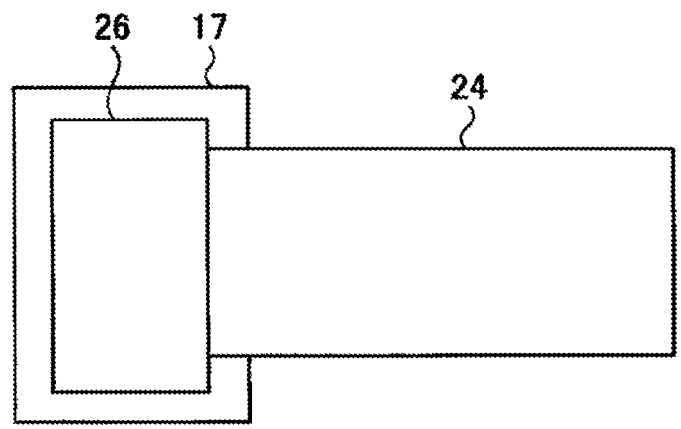

In FIG. 3B, the entire movable electrode 24 is rectangular, and an end portion of the movable electrode is fixed on the pedestal portion 17 by the fixing layer 26.

Figure 3C:
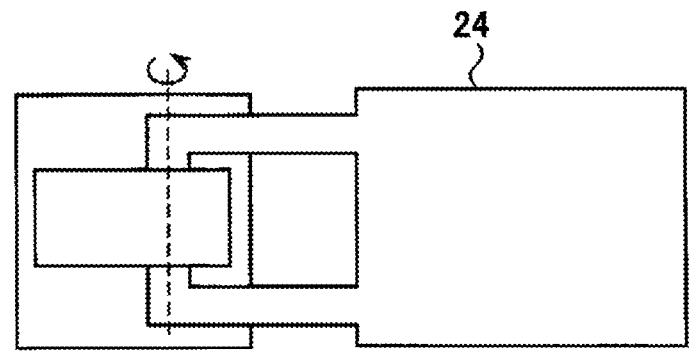

FIG. 3C illustrates a case where the movable electrode 24 has a rotation axis. The movable electrode 24 has two beams that extend from a left side of a rectangular main portion, and that are interconnected by a rotating shaft portion that is parallel to the left side of the rectangular main portion. The fixing layer 26 fixes the rotating shaft portion to the pedestal portion 17. However, the rotating shaft portion is limited in width, and is permitted to rotate to some degree.

Figure 3D:
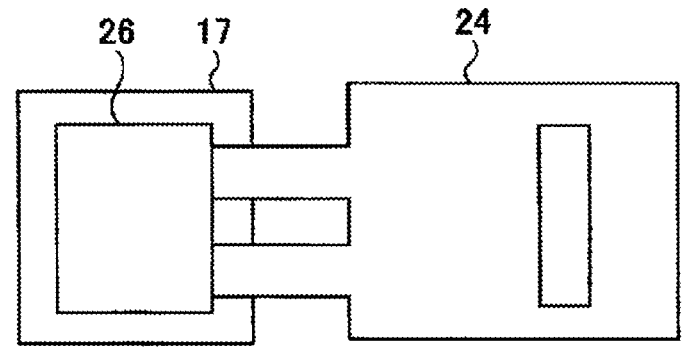

A configuration illustrated in FIG. 3D is substantially the same as that illustrated in FIG. 3A in that two beams extend from the movable electrode 24 and are fixed on the pedestal portion 17 by the fixing layer 26. However, in the configuration in FIG. 3D, a slit-shaped opening is formed in the movable electrode 24, and a further flexible beam structure is added on the right.

Figure 4A:
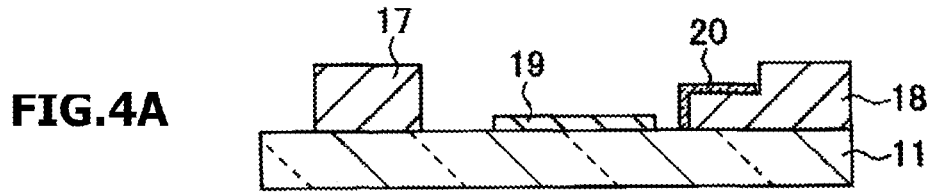
FIGS. 4A to 4F are sectional views of a substrate schematically illustrating production steps for an electric equipment that has a variable capacitance according to a second embodiment.

FIGS. 4A to 4F illustrate processes for manufacturing an electric equipment that has a variable capacitance according to second embodiment. This embodiment uses a dielectric sacrificial layer. Structure illustrated in FIG. 4A is obtained by performing substantially the same steps as illustrated in FIGS. 1A to 1F in the first embodiment. On a substrate 11 there are formed a pedestal portion 17, a control electrode 19 and a counter electrode 18 provided with an insulation film 20.

Figure 4B:

As illustrated in FIG. 4B, a recess portion is filled by a dielectric sacrificial layer 31. This is accomplished by, for example, spin coating a photosensitive organic resin. A film resist may be applied by a laminator. A desired pattern is formed by a photolithographic process according to necessity. Instead of the organic resin, an inorganic insulation material liquid may be spin-coated.

Figure 4C:
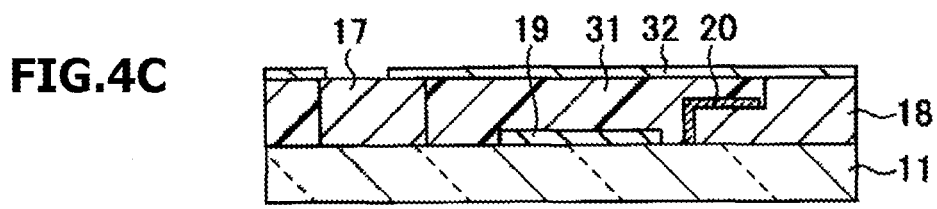

As illustrated in FIG. 4C, a seed layer 32 is formed so as to cover the pedestal portion 17 except desired areas on the pedestal portion 17. The seed layer 32 has a lamination structure of one of Ti/Cu, Cr/Cu and Mo/Cu.

Figure 4D:
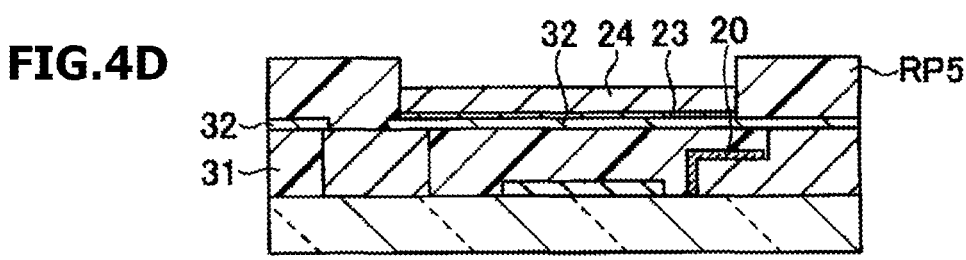

As illustrated in FIG. 4D, a resist pattern RP5 that defines a plating region is formed on the seed layer 32 and the pedestal portion 17. Using the resist pattern RP5, contiguous electrolytic plating processes of the second sacrificial layer 23 of Cu and the movable electrode layer 24 of Au are performed. This embodiment is the same as the first embodiment in that the Cu layer 23 constitutes the second sacrificial layer, and is different from the first embodiment in that the first sacrificial layer 31 is formed of a dielectric material and the seed layer 32 for plating Cu is formed on the first sacrificial layer. The interface between the second sacrificial layer 23 of Cu and the movable electrode layer 24 of Au is raised above from a bottom surface of the resist pattern RP5, and end of the interface is defined by the resist pattern RP5. Thereafter, the resist pattern RP 5 is removed.

Figure 4E:
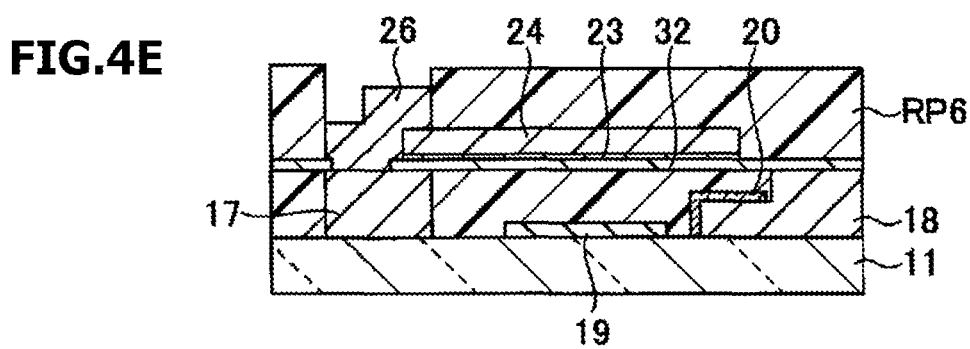

As illustrated in FIG. 4E, a resist pattern RP6 for defining a fixing layer 26 is formed, and the fixing layer 26 of Au is formed by electrolytic plating to fix the movable electrode 24 of Au. Thereafter, the resist pattern RP6 is removed.

Figure 4F:
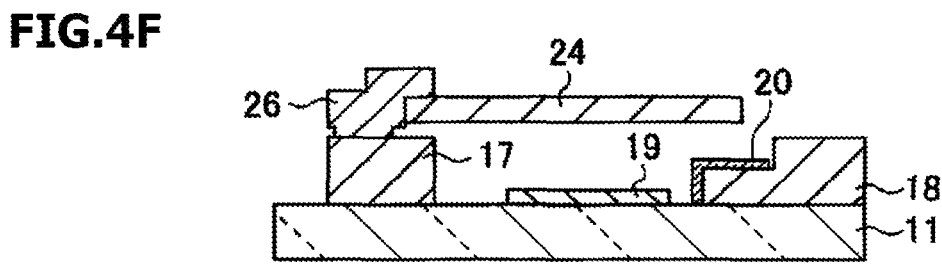

As illustrated in FIG. 4F, the second sacrificial layer 23 of Cu, the seed layer 32 and the first sacrificial layer 31 of a dielectric material are removed. The sacrificial dielectric layer can be removed by etching, and, if it is made of an organic resin, can also be removed by ashing. Similar structure as in the first embodiment can be obtained in the second embodiment, although the manufacturing processes are partly different.

While the foregoing embodiments have been described in conjunction with fabrication of a variable capacitance, a switch can also be fabricated in substantially the same manner.

Figure 5A:
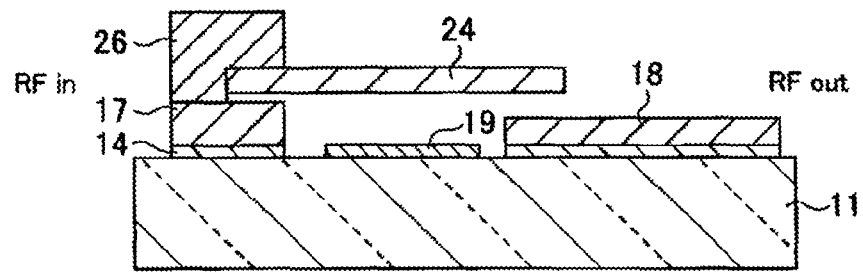
FIGS. 5A and 5B are a sectional view and an equivalent circuit diagram, respectively, illustrating an electric equipment that has a switch.

FIG. 5A is a sectional view illustrating a structure of a switch. On a substrate 11 there are formed a pedestal portion 17, a counter electrode 18 and a control electrode 19. The counter electrode is made of a member having a uniform thickness. A movable electrode 24 is disposed above and separated from an upper surface of the pedestal portion 17. A fixing layer 26 extending from the upper surface of the pedestal portion 17 to an upper surface of the movable electrode 24 supports the movable electrode 24. When the movable electrode 24 is pulled downward by a voltage applied to the control electrode 19 and contacts the counter electrode 18, the switch is turned on. When the voltage is cut off and the movable electrode 24 moves above and is separated from the counter electrode 18 due to elastic force, the switch is turned off. Since portions above a seed layer 14 are formed by layers of the same metal that have equivalent compositions and equivalent thermal expansion coefficients, warp depending on change in temperature can also be suppressed.

Figure 5B:
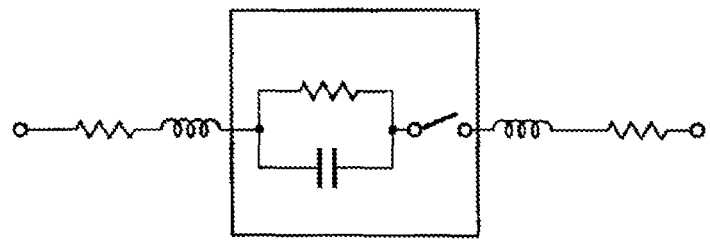

FIG. 5B is an equivalent circuit of the switch. HF line portion can be approximated by series connection of resistance and inductance, and contact portion can be approximated by parallel connection of resistance and capacitance.

Figure 5C:
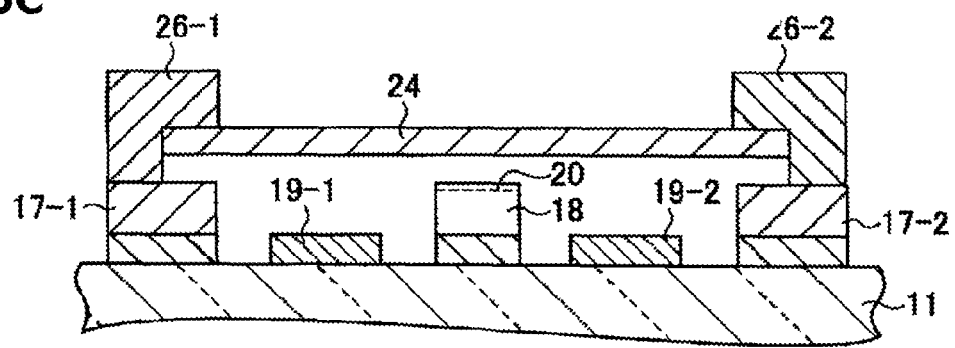
FIG. 5C is a sectional view of an electric equipment that has a two-end-supported beam structure.

FIG. 5C illustrates an example of a both-ends supported beam (a beam supported at both ends). Pedestal portions 17-1 and 17-2 are disposed at both ends of a movable electrode 24, and fixing layers 26-1 and 26-2 fix the both ends of the movable electrode 24 to the pedestal portions 17-1 and 17-2. A counter electrode 18 is disposed below a central portion of the movable electrode 24. Control electrodes 19-1 and 19-2 are disposed on both sides of the counter electrode 18. The counter electrode and the movable electrode facing each other via an air gap constitute a switch. When an insulation layer 20 is formed on a surface of the counter electrode 18, a variable capacitance is formed.

Figure 6A:
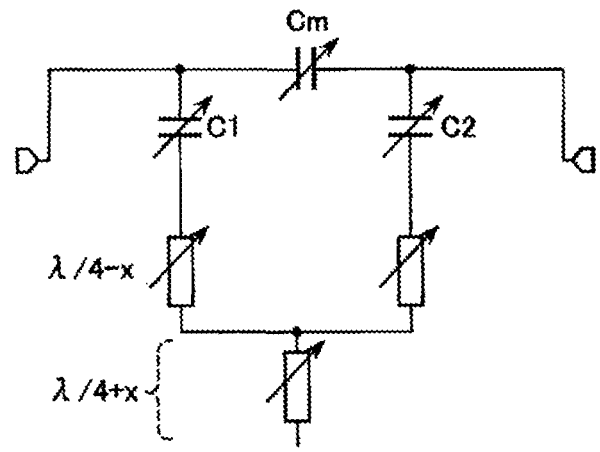
FIGS. 6A and 6B are equivalent circuit diagrams illustrating a construction of a variable filter that includes a variable capacitance.
Figure 6B:
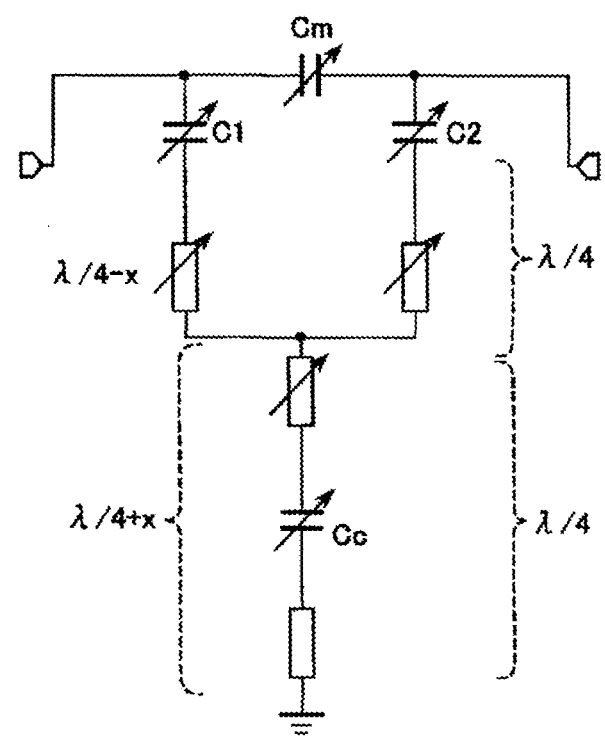

FIGS. 6A and 6B illustrate examples of variable filter circuits using variable capacitances as described above. In the drawings, C1, C2 and Cm denote variable capacitances, and elements indicated by rectangles are variable distributed constant lines that include variable capacitances.

Figure 7A:
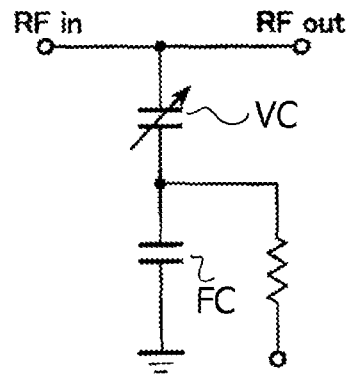
FIGS. 7A, 7B and 7C are equivalent circuit diagrams illustrating construction examples of variable capacitances.
Figure 7B:
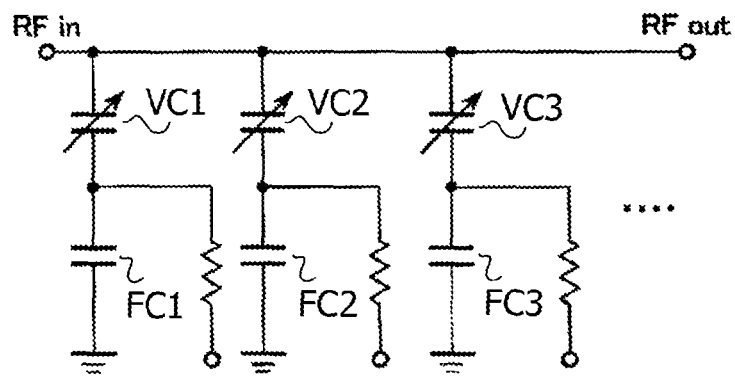
Figure 7C:
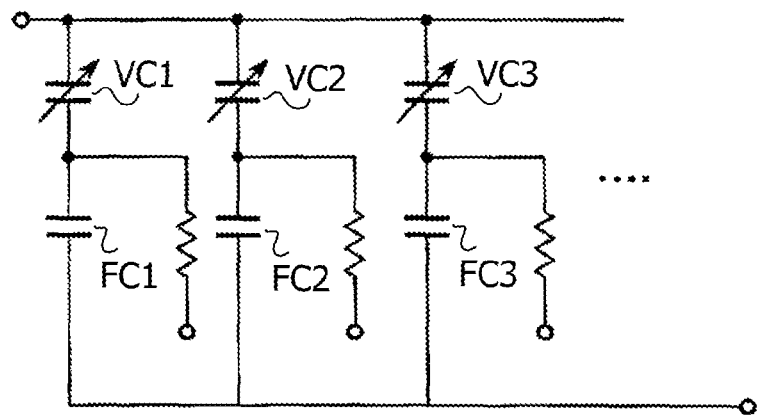

FIGS. 7A, 7B and 7C illustrate examples of variable capacitor circuits. Variable capacitances as described above can be used as the variable capacitors illustrated in these drawings.

The invention is not limited to these embodiments. For example, instead of the ceramics substrate, a glass epoxy substrate can be used. The layers described as plated layers of Au may be replaced by Au alloy layers that contain several percent of Cu, Pd, etc. and have increased hardness. The thickness of the second sacrificial film may also be increased so that the second sacrificial film is provided with a flattening function.

All examples and conditions presented herein are intended for pedagogical purposes to aid the reader in understanding the invention and the concepts contributed by the inventor(s) to furthering the art, and are to be construed as not limiting the invention. Furthermore, the organization of such examples in the specification does not relate to a showing of the superiority or inferiority of the invention.

What we claim are:

1. A method for manufacturing an electric equipment, comprising:

forming a first seed layer of a first metal material above a substrate;

after said forming the first seed layer, forming a support by plating using a first mask having a first opening defining a support area, the support including a pedestal portion of a second metal material at a location above the first seed layer and adjacent to a first space region;

after said forming the support, forming in the first space region a first sacrificial layer different in etching characteristic from the second metal material;

after said forming the first sacrificial layer, forming a second sacrificial layer of a metal material extending from the first sacrificial layer to and on a portion of a surface of the pedestal portion;

after said forming the second sacrificial layer, forming by plating using a second mask having a second opening exposing the second sacrificial layer, above the second sacrificial layer, a lower structure of a third metal material having a composition and a thermal expansion coefficient equivalent to a composition and thermal expansion coefficient of the second metal material;

after said forming the lower structure, exposing a surface of the pedestal portion not provided with the second sacrificial layer, and forming by plating using a third mask having a third opening extending from the pedestal portion to part of the lower structure, an upper structure of a fourth metal material having a composition and a thermal expansion coefficient equivalent to composition and thermal expansion coefficient of the second metal material and the third metal material; and after said forming the upper structure, removing the first sacrificial layer and the second sacrificial layer, wherein said substrate serves as substrate of the electric equipment manufactured.

2. The method for manufacturing the electric equipment, according to claim 1, further comprising:

before forming the first sacrificial layer, forming a second seed layer covering a surface exposed to the first space region, and a portion of an upper surface of the pedestal portion adjacent to the first space region;

wherein the first sacrificial layer is made of a metal material, and is formed by plating; and forming the second sacrificial layer by plating, on the first sacrificial film and on the second seed layer on the upper surface of the pedestal portion.

3. The method for manufacturing the electric equipment, according to claim 2, wherein the first sacrificial layer is made of a dielectric material, and is formed to fill the first space region; and when the second sacrificial layer is formed, the second seed layer extending from the first sacrificial layer to and on a portion of a surface of the pedestal portion is formed, and the second sacrificial layer is formed by plating on the second seed layer.

4. The method for manufacturing the electric equipment, according to claim 2, wherein the second seed layer is removed together with the first sacrificial layer and the second sacrificial layer.

5. The production method according to claim 1, further comprising:

before forming the second sacrificial layer, forming a resist pattern defining a plating region, wherein the second sacrificial layer and the lower structure are formed by successive plating commonly using the resist pattern.

6. The method for manufacturing the electric equipment, according to claim 1, wherein when the pedestal portion is formed by plating, a counter electrode structure is formed by plating in a region spaced apart from the pedestal portion by a predetermined distance, and further comprising:

thereafter removing unnecessary portion of the first seed layer.

7. The method for manufacturing the electric equipment, according to claim 6, wherein when the first seed layer is formed, forming an adhesion layer and a seed layer by sputtering on the substrate; and when the unnecessary portion of the first seed layer is removed, masking a portion of a region between the pedestal portion and the counter electrode structure using a resist pattern, removing the first seed layer exposed and the adhesion layer below the first seed layer, and removing the resist pattern to expose a control electrode.

8. The method for manufacturing the electric equipment, according to claim 6, the electric equipment having a variable capacitance, further comprising:

after forming the pedestal portion and the counter electrode structure by plating, forming an insulation film covering a region of the counter electrode structure facing the lower structure.

9. The method for manufacturing the electric equipment, according to claim 6, the electric equipment having a switch, wherein the switch in which the lower structure faces the counter electrode structure via an air gap.

10. The method for manufacturing the electric equipment, according to claim 1, wherein the lower structure of the third metal material is formed above the pedestal portion.

11. The method for manufacturing the electric equipment, according to claim 10, wherein the lower structure forms a cantilever structure supported by the pedestal portion through the upper structure after removing the first and second sacrificial layers.

12. The method for manufacturing the electric equipment, according to claim 1, wherein the lower structure of the third metal material is plated on the second sacrificial layer formed on the first sacrificial layer and the pedestal portion.

* * * * *